(12) United States Patent
Hess

(10) Patent No.: US 8,594,345 B2
(45) Date of Patent: *Nov. 26, 2013

(54) AUTOMATIC CORRECTION OF LOUDNESS LEVEL IN AUDIO SIGNALS

(75) Inventor: Wolfgang Hess, Karlsbad (DE)

(73) Assignee: Harman Becker Automotive Systems GmbH, Karlsbad (DE)

( * ) Notice: Subject to any disclaimer, the term of this patent is extended or adjusted under 35 U.S.C. 154(b) by 295 days.

This patent is subject to a terminal disclaimer.

(21) Appl. No.: 13/046,159

(22) Filed: Mar. 11, 2011

(65) Prior Publication Data

US 2011/0228953 A1    Sep. 22, 2011

(30) Foreign Application Priority Data

Mar. 12, 2010 (EP) .................................. 10156409

(51) Int. Cl.
H03G 3/00 (2006.01)
H04R 29/00 (2006.01)

(52) U.S. Cl.
USPC ................. 381/107; 381/56; 381/57; 381/86; 381/98; 381/102; 381/104; 381/106; 381/108

(58) Field of Classification Search
USPC ......... 381/56, 57, 86, 98, 102, 104, 106, 107, 381/108
See application file for complete search history.

(56) References Cited

U.S. PATENT DOCUMENTS

| 5,434,922 A | 7/1995 | Miller et al. |
| 2005/0195994 A1 | 9/2005 | Saito et al. |
| 2008/0137874 A1 | 6/2008 | Christoph |
| 2008/0253586 A1 | 10/2008 | Wei |
| 2009/0175459 A1 | 7/2009 | Marumoto et al. |
| 2009/0232320 A1* | 9/2009 | Azizi et al. ...................... 381/57 |

FOREIGN PATENT DOCUMENTS

| EP | 1619793 A1 | 7/2004 |
| EP | 1522868 A1 | 4/2005 |
| WO | WO 2004/111994 A2 | 12/2004 |
| WO | WO 2006/047600 A1 | 5/2006 |
| WO | WO 2007/085267 A2 | 8/2007 |
| WO | WO 2007/127023 A1 | 11/2007 |
| WO | WO 2008/138365 A1 | 11/2008 |

OTHER PUBLICATIONS

Blesser, Barry A.; Audio Dynamic Range Compression for Minimum Perceived Distortion; IEEE Transactions on Audio and Electroacoustics; vol. AU-17, No. 1; Mar. 1969; pp. 22-32.

(Continued)

*Primary Examiner* — Vivian Chin
*Assistant Examiner* — Paul Kim
(74) *Attorney, Agent, or Firm* — O'Shea Getz P.C.

(57) ABSTRACT

Systems and method for adapting a gain of an audio signal containing at least two different tracks with different signal level ranges. An example system includes a loudness determination unit for determining a perceived loudness of the audio input signal based on a psychoacoustic model of a human hearing. The system further includes a loudness adaptation unit configured to determine a loudness adaptation indicator based on the perceived loudness and a predetermined loudness, and to introduce the loudness adaptation indicator into the audio signal to generate an adapted gain signal. A gain determination unit is configured to adapt the gain for outputting the audio signal containing the at least two tracks based on the loudness adaptation indicators in the adapted gain signal at about the predetermined loudness.

17 Claims, 9 Drawing Sheets

(56) References Cited

OTHER PUBLICATIONS

Lindemann, W.; Extension of a binaural cross-correlation model by contralateral inhibition. I. Simulation of lateralization for stationary signals; J. Acoust. Soc. Am 80 (6); Dec. 1986; pp. 1608-1622.

Recommendation ITU-R BS.1770-1; Algorithms to measure audio programme loudness and true-peak audio level; 2006-2007; pp. 1-19.
Hess, Wolfgang, et al.; Acoustical evaluation of virtual rooms by means of binaural activity patterns; Audio Engineering Society; Convention Paper 5864; 115th Convention; Oct. 10-13, 2003; New York, NY.

* cited by examiner

AUTOMATIC CORRECTION OF LOUDNESS LEVEL IN AUDIO SIGNALS

RELATED APPLICATIONS

This application claims priority of European Patent Application Serial Number 10 156 409.4, filed on Mar. 12, 2010, titled AUTOMATIC CORRECTION OF LOUDNESS LEVEL IN AUDIO SIGNALS, which application is incorporated in its entirety by reference in this application.

BACKGROUND

1. Field of the Invention

This invention relates to audio signal processing and, in particular, to methods and systems for adapting a gain of an audio output signal.

2. Related Art

Audio systems may process audio from many different sources of audio signals that may contain music and/or speech. Audio signals containing music may be stored on a CD, a DVD or on any other suitable storage medium. Recent developments in compression schemes such as MPEG allow for audio signals with music and/or speech from different genres and artists to be stored on a storage medium and combined in a playlist to be played out to a user. The audio signals are typically derived from different audio sources having different signal and dynamics compression levels. The audio sources may be from different tracks that have different signal level ranges. When played out, for example in a playlist, the different tracks may be perceived by the user as being at different loudness levels.

In a vehicle environment, audio perceived by passengers may contain the audio signal itself and noise, which may include road tire noise, aerodynamics noise and engine noise. Audio signals played in a vehicle environment should be perceivable to the user, which means that the audio signal loudness should exceed the noise present in the vehicle. The overall audio level, which includes the audio signal and the noise, should not exceed a level that may result in hearing damage or be painful to the listener.

There is a need for audio systems that controls audio signal output levels to permit a listener to perceive the audio signals from different tracks at a consistent sound level.

SUMMARY

In view of the above, systems and methods are provided for adapting a gain of an audio signal containing at least two different tracks with different signal level ranges. In an example method, a perceived loudness of the audio signal based on a psychoacoustic model of a human hearing is dynamically determined. Loudness adaptation indicators are generated based on the perceived loudness and a predetermined loudness. The loudness adaptation indicators are introduced into the audio signal to generate an adapted audio signal. The audio signal gain is dynamically adapted for outputting the audio signal containing the at least two tracks based on the loudness adaptation indicators in the adapted audio signal with an average loudness at about the predetermined loudness.

An example system for adapting a gain of an audio signal containing at least two different tracks with different signal level ranges includes a loudness determination unit for determining a perceived loudness of the audio input signal based on a psychoacoustic model of a human hearing. The system further includes a loudness adaptation unit configured to determine a loudness adaptation indicator based on the perceived loudness and a predetermined loudness, and to introduce the loudness adaptation indicator into the audio signal to generate an adapted gain signal. A gain determination unit is configured to adapt the gain for outputting the audio signal containing the at least two tracks based on the loudness adaptation indicators in the adapted gain signal at about the predetermined loudness.

Other devices, apparatus, systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The description below may be better understood by referring to the following figures. The components in the figures are not necessarily to scale, emphasis instead being placed upon illustrating the principles of the invention. In the figures, like reference numerals designate corresponding parts throughout the different views.

DETAILED DESCRIPTION

Figure 1:
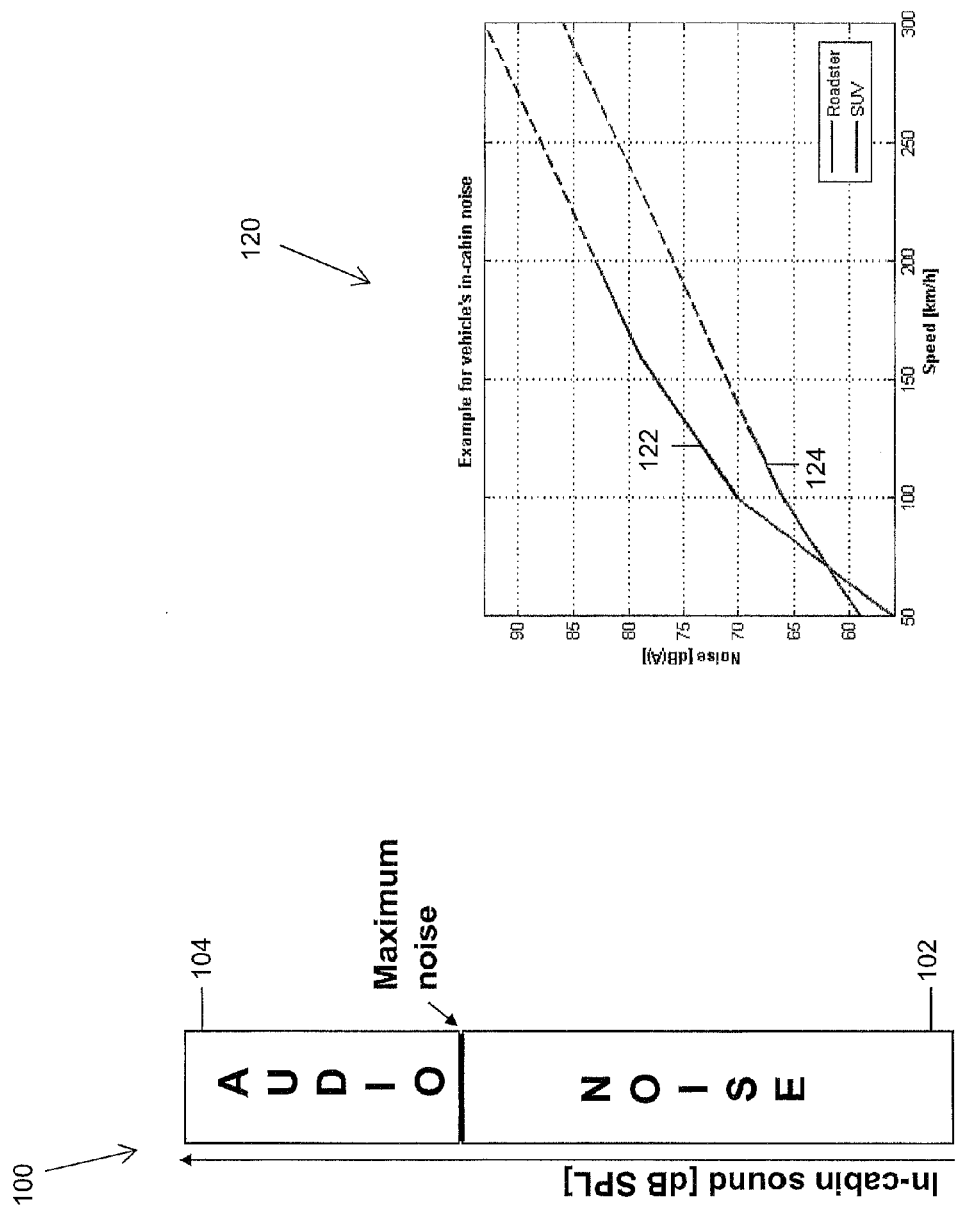
FIG. 1 is a schematic diagram illustrating the general components of sound in a vehicle and a graph illustrating the effect of vehicle speed on vehicle in-cabin noise.

Occupants of a vehicle may perceive different ambient noises in addition to audio signals that the occupants may wish to perceive. The noise may vary with a variety of factors including the type of vehicle being driven. FIG. 1 is a schematic diagram illustrating the general components of sound 100 in a vehicle and a graph 120 illustrating the effect of vehicle speed on vehicle in-cabin noise. The vehicle sound signal 100 includes noise components 102 and an audio signal component 104. Sound 100 is typically measured in decibels sound pressure level ("dB SPL"). The audio signal component 104 represents sound that the vehicle occupants have an interest in hearing, such as audio from an entertainment system (radio, CD player, MP3 player, and any other suitable entertainment audio source). The noise signal component 102 includes the ambient noise that may interfere with the user's ability to hear the audio signal components 104, such as, for example, road tire noise, aerodynamic noise, or engine noise. Entertainment systems employ amplifying components to amplify the audio output to the occupants. The audio output is amplified according to a "gain," which is a typically a multiplier used on the audio output signal levels to increase or decrease the volume. The user is typically given control of the volume via a knob, or other suitable user interface components.

In a vehicle, ambient noise may vary with a variety of factors. As shown in the graph 120 in FIG. 1, the vehicle speed is one such factor, which may also vary with different types of vehicles. The graph 120 in FIG. 1 includes a first curve 122 showing the noise generated in a roadster or sports car, and a second curve 124 showing the noise generated by a sport utility vehicle ("SUV"), both curves 122, 124 plotted against the vehicle speed. As shown in the graph 120, the noise can be as high as between 60 and 85 dB SPL at a typical range of vehicle speeds. The hearing pain threshold is about 120 dB SPL. In order to ensure comfortable hearing of audio signals, the audio output should be in the range of within about 20-40 dB SPL.

Figure 2:
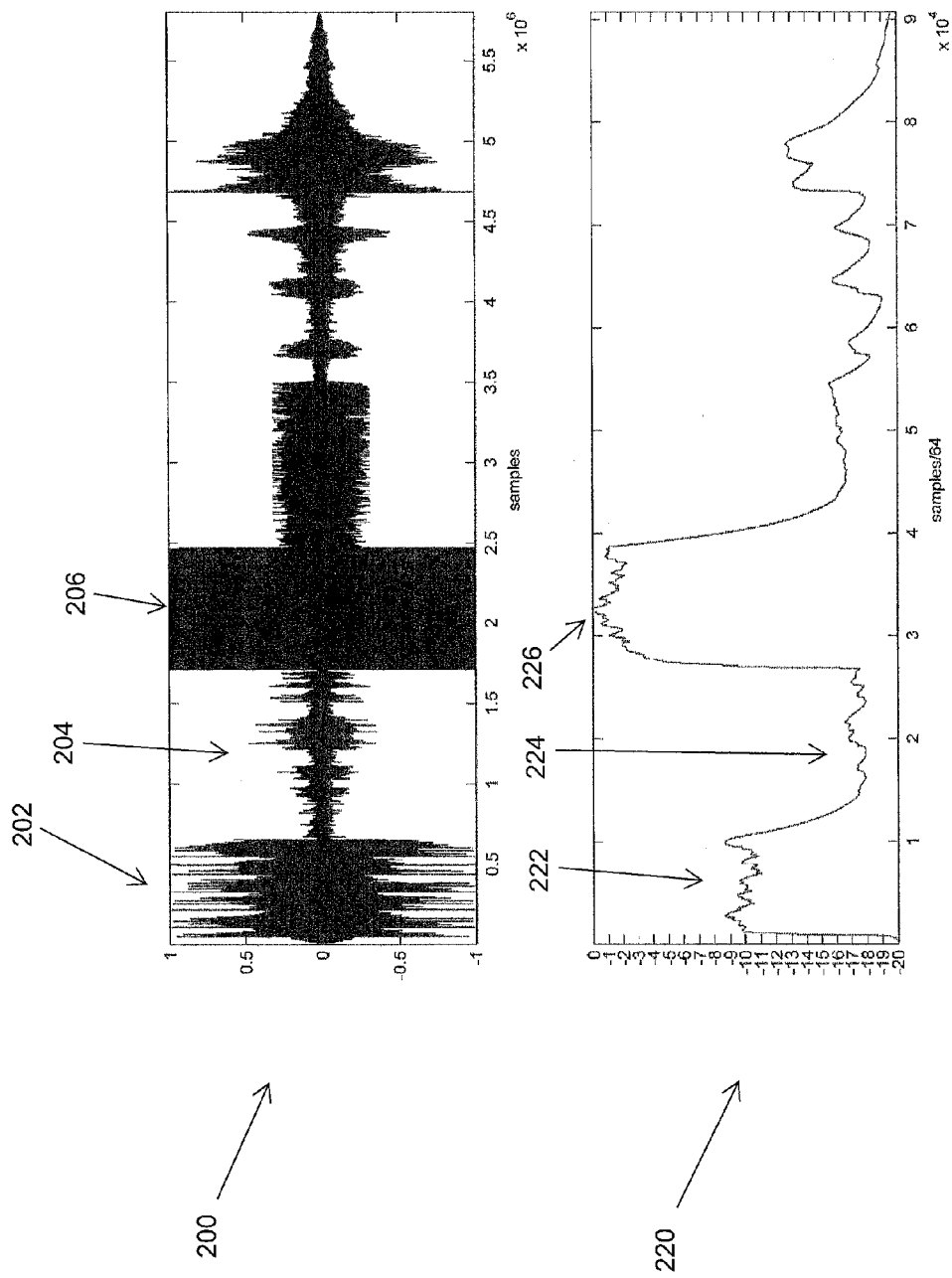
FIG. 2 shows graphs illustrating an example of an audio signal and the estimated loudness of the audio signal without gain adaptation.

FIG. 2 shows graphs illustrating an example of an audio signal 200 and the estimated loudness of the audio signal 220 without gain adaptation. The audio signal 200 is shown in full scale, meaning that 0 dB full scale (0 dBFS) is assigned to the maximum possible signal level in the digital domain. A first portion of the audio signal 202 varies between high and low level signals in the full range of the signal level. A second portion 204 varies between high and low levels in a much smaller range of the signal level. A third portion 206 appears to saturate the signal level. The first and second portions 202, 204 may represent audio sound from a music signal source and the third portion 206 may represent noise in the audio signal, such as white noise in an audio gap between tracks that has been amplified at the audio output.

The estimated loudness of the audio signal 220 illustrates how occupants may perceive the audio signal 200. The first portion of the audio signal 202 may be perceived as shown in a first loudness portion 222. The second portion of the audio signal 204 may be perceived as shown in a second loudness portion 224 that is less than the first loudness portion 222. The third portion of the audio signal 206 may be perceived as shown in a third loudness portion 226 that is the highest of the three portions. The loudness estimation may be performed using a variety of models, one of which is described in Recommendation ITU-R BS. 1770-1 ("Algorithms to Measure Audio Program Loudness and to a Peak Audio Level") incorporated by reference in its entirety. In the present application loudness may be estimated through a binaural localization model.

Figure 3:
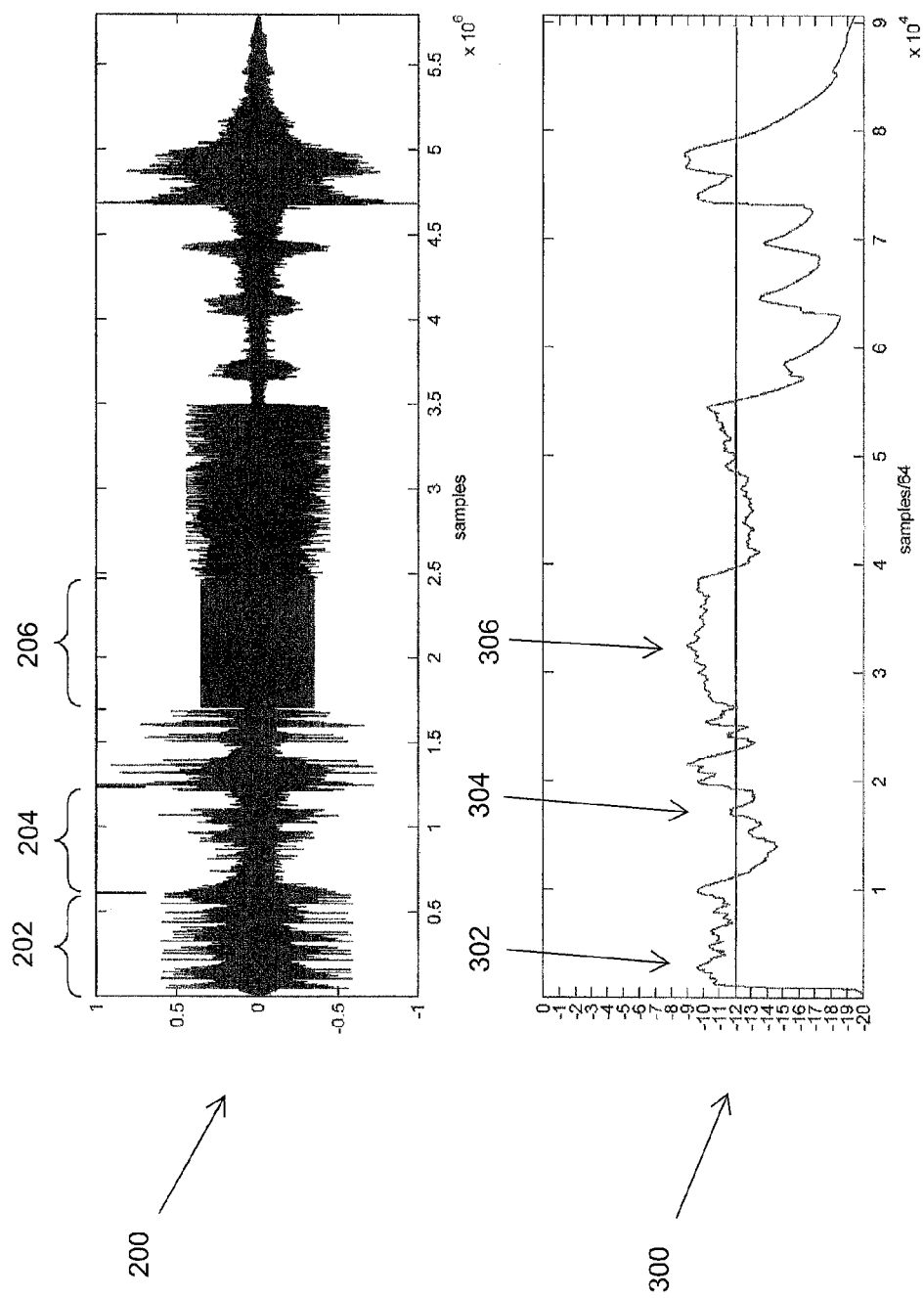
FIG. 3 shows graphs illustrating operation with a dynamic gain adjustment of the audio signal.

When played to vehicle occupants, some parts of the audio signal 202, such as the third portion 206, may be perceived as unpleasantly loud. Other parts of the audio signal 202, such as the second portion 204, may be too low to be correctly perceived by the user. FIG. 3 shows graphs illustrating operation with a dynamic gain adjustment of the audio signal 200. An estimated loudness 300 in FIG. 3 shows the first portion of the audio signal 202 perceived as shown in a first loudness portion 302. The second portion of the audio signal 204 is perceived as shown in a second loudness portion 304. The third portion of the audio signal 206 is perceived as shown in a third loudness portion 306. The portions of the estimated loudness 302, 304, 306 in FIG. 3 corresponding to the portions of the audio signal 202, 204, 206 are more comparable illustrating a more even perception of the different levels of audio. The estimated loudness 300 results from dynamic gain adaptation of the audio signal 200. The dynamic gain adaptation may output the signal samples in the first audio signal portion 202 at a first signal level, the signal samples in the second audio signal portion 204 at a second signal level higher than the first signal level, and the signal samples of the third audio signal portion 206 at an attenuated level. A comparison of the estimated loudness 220 in FIG. 2 with the estimated loudness 300 in FIG. 3 illustrates that a listener's loudness evaluation represented by estimated loudness 300 in FIG. 3 would be preferred over the loudness evaluation illustrated by the estimated loudness 220 in FIG. 2. The more even estimated loudness 300 in FIG. 3 provides a smoothed, relatively constant loudness compared to that of the loudness 220 in FIG. 2.

In example implementations, the samples of audio signal 200 in FIG. 2 may originate from different tracks of audio signals provided on a single signal source. The signal source for multiple tracks, for example, may be a storage medium (e.g. a hard disk). Different tracks or pieces of music may be from distinct sources. For example, a first track may be from a CD/DVD, whereas a second track may be played out from a hard disk on which music signals may be stored in a compressed format such as MP3. Different tracks may also be stored on a hard disk in a compressed or non-compressed format.

Figure 4:
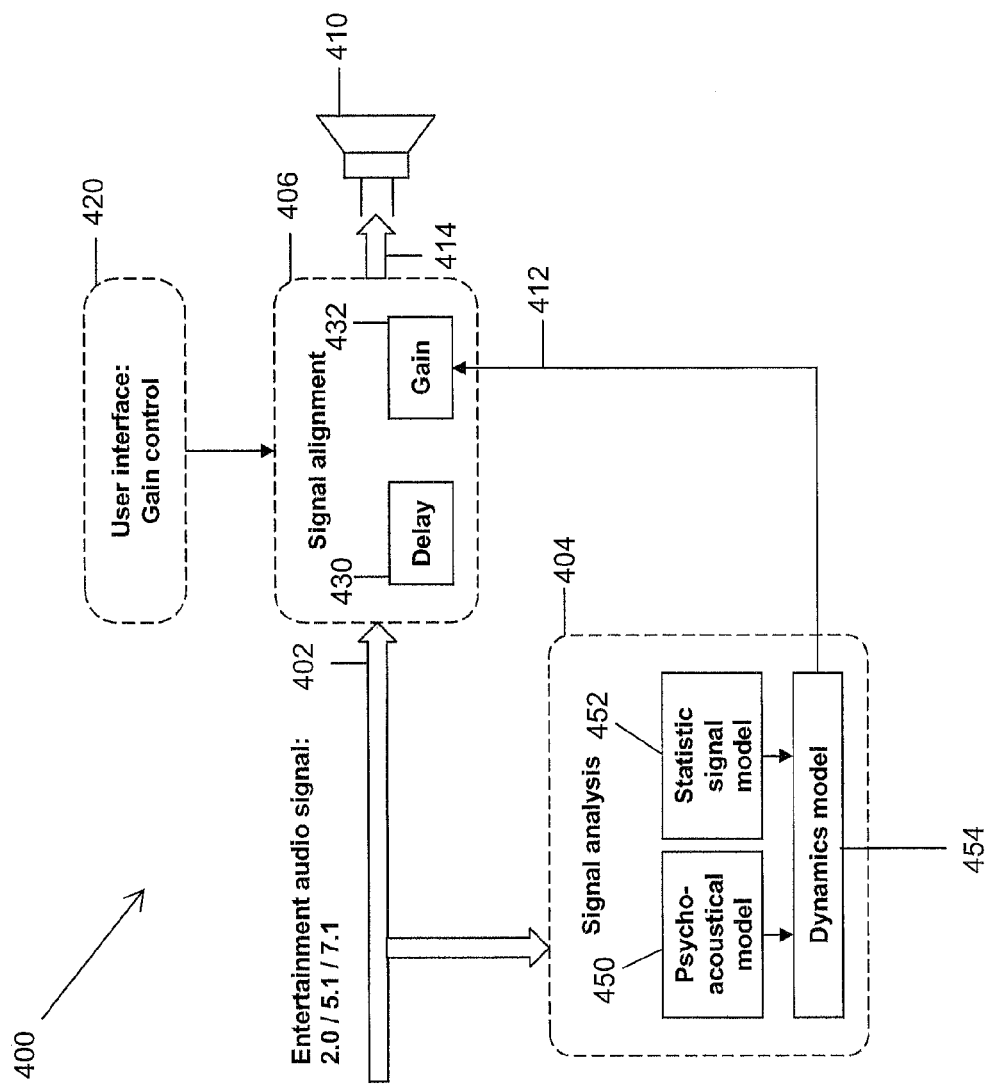
FIG. 4 is a block diagram of an example of a system for adapting the gain of an audio signal.

FIG. 4 is a block diagram of an example of a system 400 for adapting the gain of an audio signal 402. The system 400 includes an audio signal analyzing unit 404, a signal controller 406, and an audio transducer 410. The audio signal analyzing unit 404 determines the loudness of the audio signal 402, which may include an entertainment audio signal. The entertainment or audio signal 402 may include a 2.0, 5.1 or 7.1 audio signals or any other signals in a suitable audio format.

The loudness may be determined using a psycho-acoustical localization model of the human hearing and by using signal statistical analysis. The audio signal 402 is input to the signal controller 406, which includes a delay element 430 and a gain control unit 432. The gain control unit 432 determines an output gain to be applied to the audio signal based on a gain adaptation provided by the audio signal analyzing unit 404 and an un-processed, or raw, gain setting, which may be controlled by a user via a user interface 420. The gain control unit 432 may determine, for example, the extent to which an adapted gain is used over the raw gain setting on the audio output signal 414 that is output to the audio transducer 410 or to a post-processing stage (not shown).

The signal analyzing unit 404 in FIG. 4 includes a psycho-acoustical model loudness function 450 and a statistical signal model loudness function 452. The psycho-acoustical model loudness function 450 determines the estimates loudness, localization of sound, and whether noise is present in the audio input signal as a dominant factor (for example, during a pause in a track or a pause between two tracks). The statistical signal model loudness function 452 may be used as a second basis for determining or estimating the loudness and for determining whether a pause with noise is present in the audio signal 402. For example, the statistical model loudness function 452 may determine the signal strength of the entertainment audio signal 402. Based on the psycho-acoustical model function 450 alone, or in combination with the statistical signal model function 452, a perceived loudness may be determined. The perceived loudness may then be used to dynamically determine loudness adaptation indicators as described further below with reference to FIGS. 5 and 6.

The signal analyzing unit 404 includes a dynamic model function 454 that uses the perceived loudness to determine loudness adaptation information for introduction into the audio signal 402. The dynamic model function 454 also includes a gain determination function to determine an adapting gain for the adapted audio signal formed by the audio signal 402 and introduced loudness adaptation information.

The signal analyzing unit 404 outputs a gain adapted signal 412 to the gain control unit 432.

Figure 5:
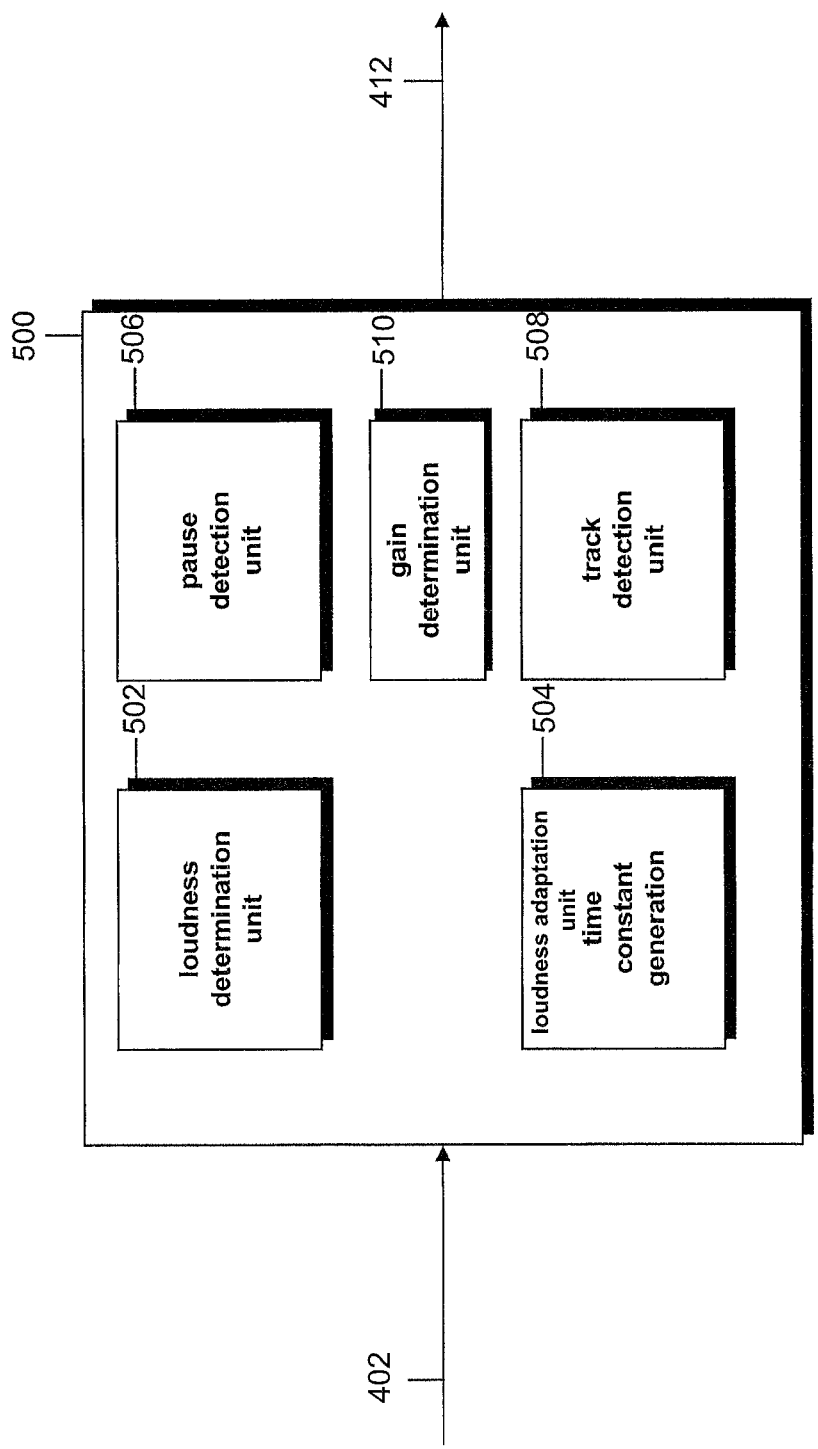
FIG. 5 is a block diagram of an example of an audio analyzing unit that may be used in the system in FIG. 4.

FIG. 5 is a block diagram of an example of an audio analyzing unit 500 that may be used in the system 400 in FIG. 4. The audio signal analyzing unit 500 in FIG. 5 includes a loudness determination unit 502, a loudness adaptation unit 504, a pause detection unit 506, a track detection unit 508, and a gain determination unit 510. The loudness determination unit 502 estimates a perceived loudness of the received audio signal 402. The loudness determination unit 502 may determine the loudness using methods known in the art. In one example, the loudness determination unit 502 uses the binaural model of human hearing for determining loudness and for determining whether and where the audio signal 402 could be localized by a user when hearing the audio signal 402. The binaural model simulates the spatial perception of the audio signal and enables a determination of whether the audio signal contains mainly noise or any other input signal, such as music or speech. The localization of the audio signal 402 may be performed is described in more detail in the following references, which are incorporated herein by reference:

(1) EP 1 522 868 A1;
(2) "Acoustical Evaluation of Virtual Rooms by Means of Binaural Activity Patterns" by Wolfgang Hess et al. in Audio Engineering Society Convention Paper 5864, 115th Convention, October 2003;
(3) W. Lindemann "Extension of a Binaural Cross-Correlation Model by Contralateral Inhibition. I. Simulation of Lateralization for Stationary Signals", in Journal of Acoustic Society of America, December 1986, p. 1608-1622, Vol. 80 (6).

The localization of the audio signals is used to distinguish noise from other sound signals and for avoiding the output of the noise at an increased gain if only noise is detected in the audio signal.

The loudness determination unit 502 may also use statistical signal processing to estimate the loudness of the audio signal 402 or to detect signal pauses. A statistical analysis of the audio signal 402 involves determining the actual signal level of different samples of the audio signal 402. If the signal level of a sequence of consecutive samples of the audio signal 402 follows a Gaussian distribution, the sequence of samples is indicated as containing noise and no other signal.

The audio signal analyzing unit 500 includes the loudness adaptation unit 504, which uses the result of the loudness estimation to determine loudness adaptation indicators and introduces the loudness adaptation indicators into the audio signal 402. Loudness adaptation indicators may be used by the gain determination unit 510 to determine an adapted gain setting that would maintain a substantially consistent loudness level. Loudness adaptation indicators may be implemented by defining data elements as indicating increasing or decreasing loudness. In one example, the loudness adaptation indicators may be time constants that indicate whether the loudness should be increasing or decreasing. The time constant may also indicate whether the increase or decrease should be fast or slow.

Figure 6:
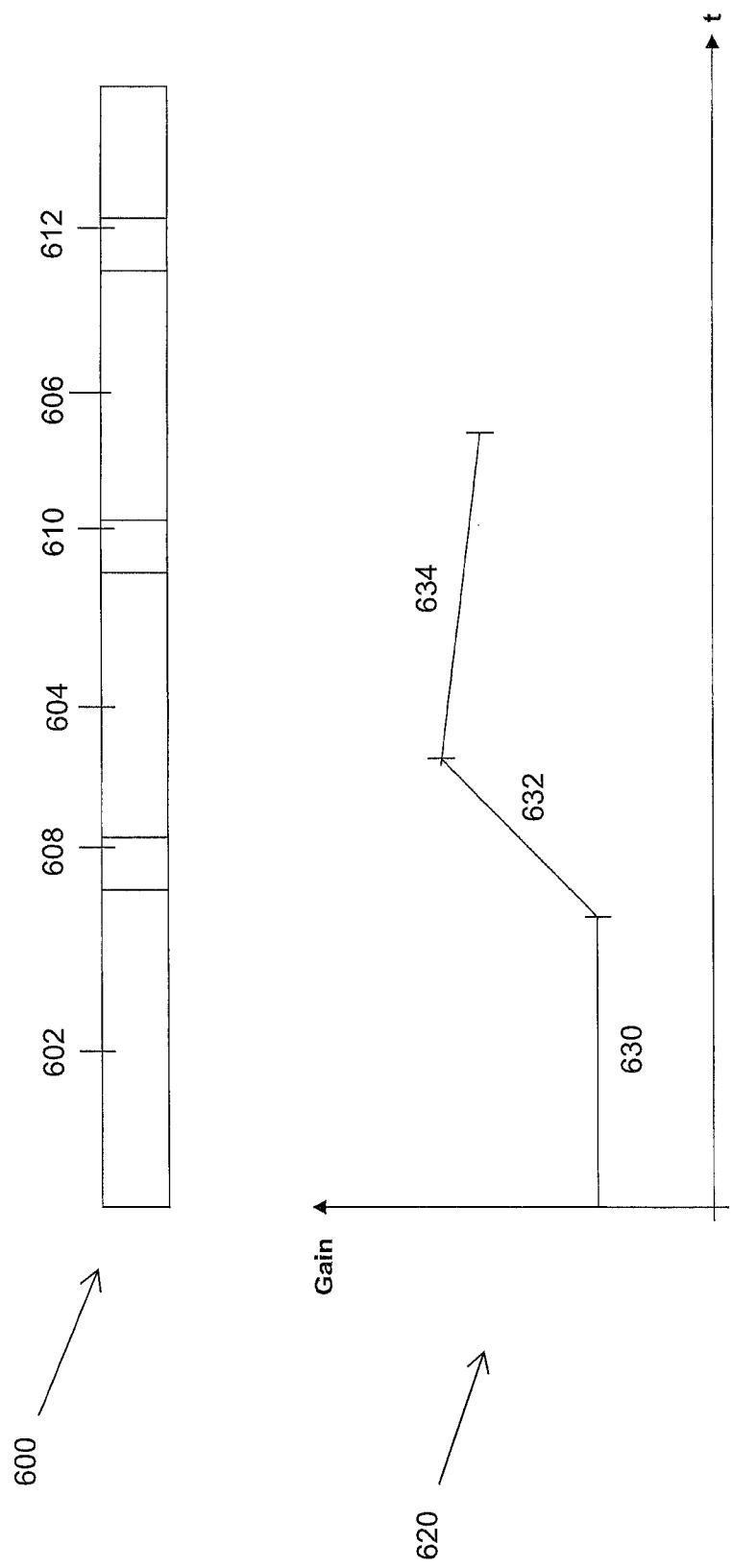
FIG. 6 illustrates the introduction of time constants into the audio signal.

FIG. 6 illustrates the introduction of time constants into the audio signal 402. FIG. 6 shows a sequence of audio signal samples 602, 604, and 606, which may represent a three sample sequence from a stream of signal samples forming the audio signal. A first time constant 608 is introduced into the audio signal between the first sample 602 and the second sample 604. A second time constant 610 is introduced between the second sample and the third sample 606. A third time constant 612 is introduced into the audio signal after the third sample 606. The time constants 608, 610, 612 indicate how the loudness should be adapted from one sample to the next sample. The time constants 608, 610, 612 may be either raising time constants or falling time constants. A raising time constant indicates how the signal gain is increased from one sample to the next sample. A falling time constant indicates how the signal gain is decreased from one sample to the next sample.

The time constants 608, 610, 612 may be defined and implemented to adapt the gain more rapidly for raising time constants than for falling time constants. The time constants may also be defined or implemented to adapt the gain in accordance with the audio signal content. If a signal pause is detected between two tracks or within a track, the audio signal level should not be increased in order to avoid amplifying noise in the pause. When a new track starts or when the pause ends, high signal levels may follow directly after very low signal levels. The raising time constants of the loudness estimation may be adapted accordingly in order to avoid too high a signal level at the beginning of a new track. The falling time constant that may be used when an audio signal level decreases allows for a slower decrease in signal level compared to the increase when a rising time constant is used for an audio signal increase. The time constants may also be implemented as adaptive time constants that adapt the gain more slowly as a track gets longer. The adaptive time constants may operate similarly for the increasing and decreasing time constants. The time constants may be implemented to provide a smoothed loudness estimation that may be similar to the manner in which humans perceive loudness. Peaks and dips in loudness are smoothed out by the human auditory system. The slower varying time constants towards the end of an audio track help to maintain the dynamics of the audio signal. In addition, when a music signal has a long runtime, a shorter reaction time for increasing loudness provides an adequate reaction to fast increases in signal levels.

The loudness adaptation indicators, implemented as the time constants in an example implementation, a gain may be determined for portions of the audio signal and adapted as indicated by the time constants for changes in the loudness. The audio signals may be processed in blocks to save processing time compared to a sample-by-sample processing. The time constants may be used to adjust the gain for each block. The target gain for a block n may be attained in a linear ramp starting from the target gain of the previous block n−1. FIG. 6 shows a graph 620 of gain increasing and decreasing for a music signal over time. The graph 620 shows a first signal block 630 of music samples at a first gain. The first signal block 630 is followed by a second signal block 632 showing an increasing gain, which is followed by a third signal block 634 having a slightly decreasing gain.

Referring back to FIG. 6, the gain determination unit 510 adapts the gain of the audio signal 402 using the estimated perceived loudness and the loudness adaptation indicators. The loudness determination unit 502 provides the estimated perceived loudness for a portion, or block, of the audio signal as a dB loudness equivalent (dBLEQ). The gain determination unit 510 also uses a predefined signal level as a target signal level at which the audio signal should be output. For example, a desired loudness could be set as a predefined −12 dB, which is used below in FIGS. 7 and 8, although any desired loudness level may be used. The predefined level is set as a mean signal level. The gain determination unit 510 subtracts the determined estimated perceived loudness from the mean signal level to calculate an adapted gain. For example, if the determined perceived loudness corresponds to −5 dB and the target signal level is −12 dB full scale, the gain may be adapted accordingly by decreasing the gain to arrive at an average signal level of about −12 dB.

The audio signal analyzing unit 500 includes the pause detection unit 506 to detect a pause in a track or between two tracks. The pause detection unit 506 may detect a pause by identifying a block or sequence of blocks having audio signal samples with values that have a Gaussian distribution, which indicates that the blocks or sequence of blocks include noise signals and no otherwise meaningful signals. Alternatively, or in combination, a pause may be identified by determining if the audio signal in a block of samples can be localized as described above with reference to FIG. 4. The track detection unit 508 be used to determine if the pause defines a gap between two tracks. In an example implementation, the gain is decreased for a pause if the pause is detected over a predetermined time period. For example, the gain may be decreased for a pause lasting between 10-100 ms, or more than 50 ms. The gain may be selectively lowered to avoid decreasing the gain during a track in which a very short period is detected with no music signal. For example, if the audio signal includes more information and the input signal level is quite low, then the gain is adapted accordingly by increasing the gain so that the audio signal covers the predetermined range of signal levels.

It is noted that the audio signal analyzing unit 500 in FIG. 5 includes the loudness determination unit 502, the loudness adaptation unit 504, the pause detection unit 506, the track detection unit 508, and the gain determination unit 510 depicted as separate units. Those of ordinary skill in the art would understand that the different units may be incorporated into fewer units and that the units may be combined in several units or even in one unit. Furthermore, the signal analyzing unit 500 may be implemented in hardware or software or by a combination of hardware and software.

Referring back to FIG. 4, the signal output 412 of the signal analyzing unit 404 is input to the gain control unit 432. The gain control unit 432 may be used to control the gain of the audio signal output to the audio transducer as described below. The signal control unit 406 includes the delay element 430 to introduce the delay into the audio signal 402. The delay may be the time it takes the signal analyzing unit 404 to determine the adapted gain.

The gain control unit 432 may be used to determine the extent to which the adapted gain determined by the gain determination unit 510 (in FIG. 5) is applied to the audio signal output to the audio transducer 410. The user interface 420 includes a user input mechanism to permit the user to indicate a desired percentage of gain correction. For example, if the user desires 100% of the gain to be adapted gain, the adapted gain values determined by the gain determination unit 510 (in FIG. 5) are used as the output gain. However, the user may not want gain adaptation. For example, the user may want to maintain the loudness evolution in a piece of music. To do so, the user may set the gain adaptation in the gain control unit 432 to 0% to inhibit use of the adapted gain on the audio signal output to the audio transducer 410. A gain associated with a volume level or some other non-adapted gain would be used instead. The gain control unit 432 allows the user to set an amount of gain correction by setting a factor between 0% and 100%. If a factor of 0% is set, the gain is determined without the influence of the time constants.

Figure 7:
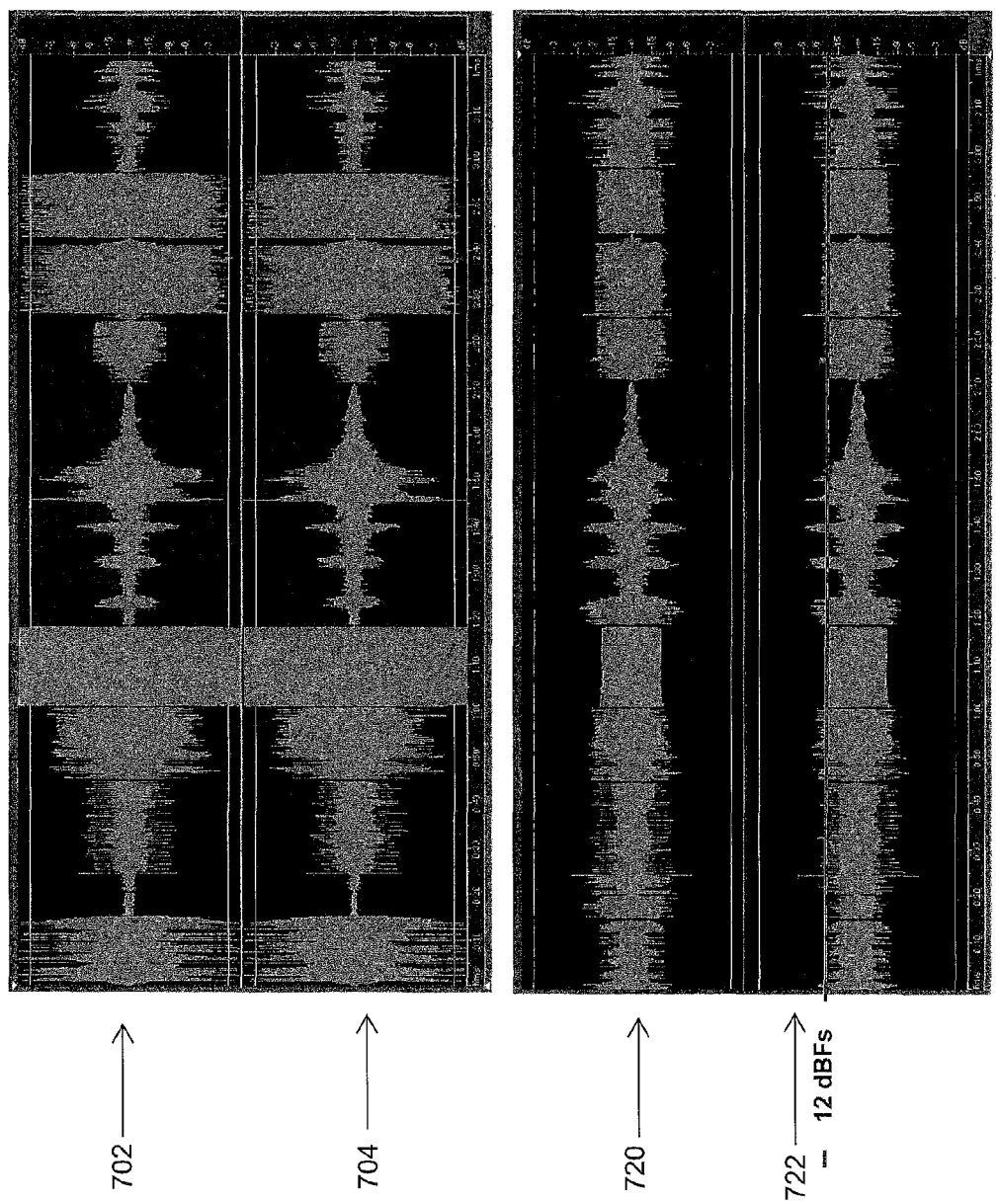
FIG. 7 shows graphs illustrating example audio signals before and after automatic loudness adaptation.

FIG. 7 shows graphs illustrating example audio signals before and after automatic loudness adaptation. FIG. 7 shows an example first channel 702 and a second channel 704 of an audio signal before loudness adaptation is performed. The audio signal in the two channels 702, 704 includes signal samples that cover different level ranges. FIG. 7 also shows the audio signal after loudness estimation and gain adaptation at 720 and 722. The audio signal at 722 is shown with the average signal level set to −12 dB full scale while preserving the dynamic structure of the audio signal.

Figure 8:
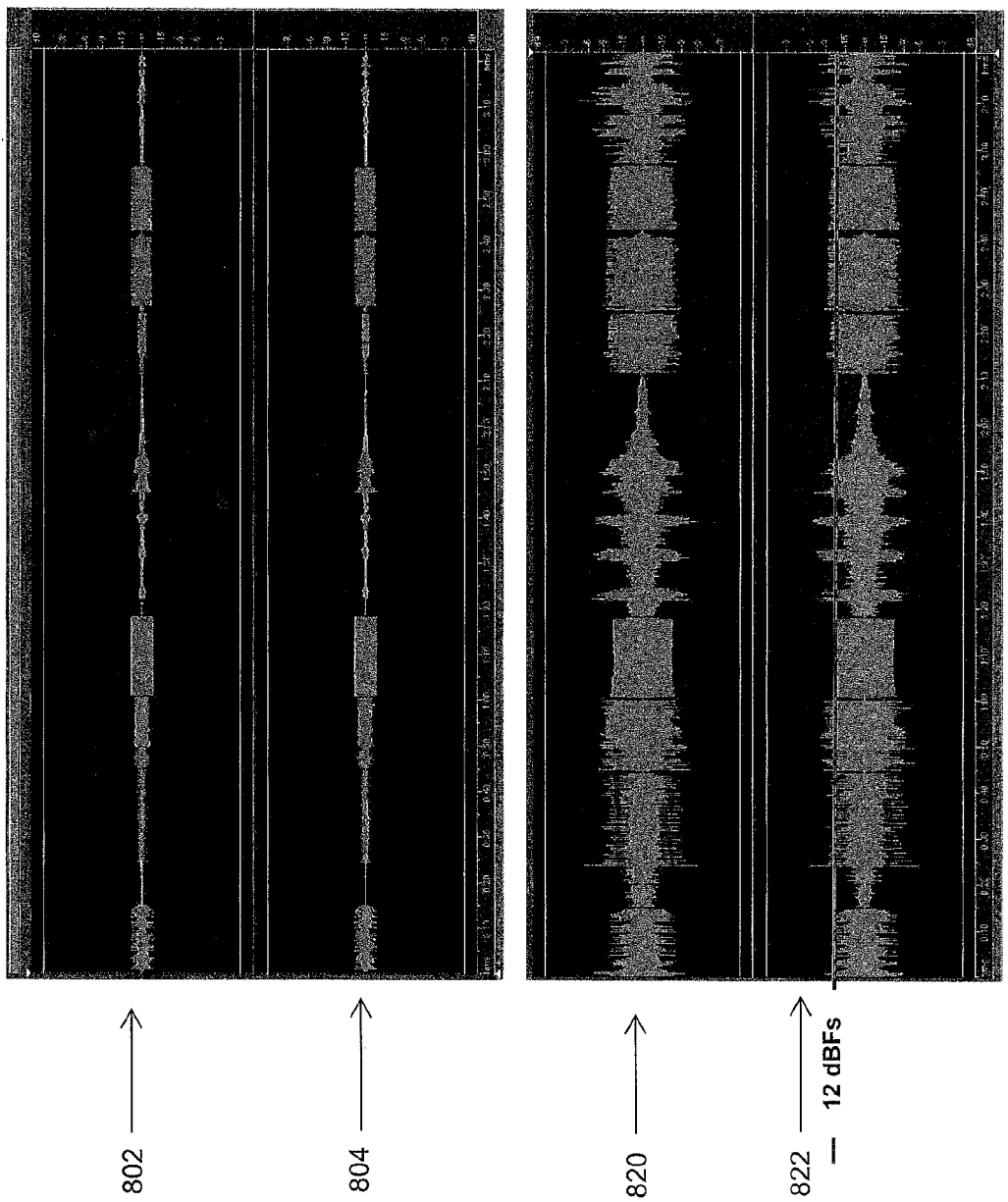
FIG. 8 shows graphs illustrating another example of audio signals before and after automatic loudness adaptation.

FIG. 8 shows graphs illustrating another example of audio signals before and after automatic loudness adaptation. FIG. 8 shows a first and second channel 802, 804 of an audio signal in which the input level has a maximum level of −20 dB full scale. FIG. 8 also shows the audio signal 820 after loudness estimation and gain adaptation. Again the dynamic structure is preserved and the average signal level is again set to −12 dB full scale at 822. If the audio signal channels 702, 704, 802, 804 shown in FIGS. 7 and 8 were output as audio to the user, the user would have to repeatedly adjust the volume to avoid signal levels that are unpleasantly high and in order to increase the signal for parts of the audio signal where the signal level is too low for listening. FIGS. 7 and 8 illustrate how the loudness and gain may be adapted to output an audio signal that eliminates the need to repeatedly adjust the volume. The dynamic automatic correction of a loudness level in audio signals that may be attained by the automatic loudness and gain adaptation may be used in a noisy environment, such as in a vehicle, but also in environments where listening to movie sounds or music should not exceed a certain loudness, such as for example, in home theatre at night.

Figure 9:
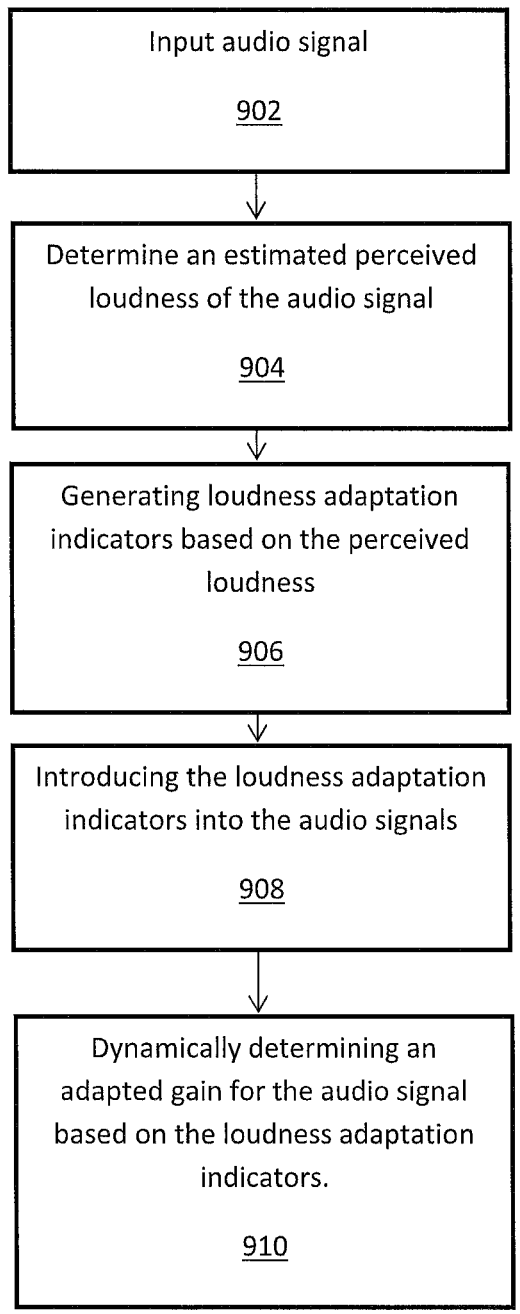
FIG. 9 is a flowchart illustrating operation of an example method for adapting a gain of an audio signal.

FIG. 9 is a flowchart illustrating operation of an example method for adapting a gain of an audio signal. In an example method, an audio signal is input at step 902. The audio signal may include entertainment signals input as 2.0, 5.1 or 7.1 audio signals or any other signals in a suitable audio format. An estimated perceived loudness of the audio signal is determined at step 904. The estimated loudness may be determined using a psycho-acoustical localization model of the human hearing. The audio signal may be processed in any suitable size portions, or blocks of audio samples. At step 906, loudness adaptation indicators such as time constants are determined. The loudness adaptation indicators may be introduced into the audio signal at step 908. The loudness adaptation indicators may be introduced between audio signal samples as described above with reference to FIG. 6. At step 910, an adapted gain is determined for blocks of audio signal samples based on the loudness adaptation indicators. The audio signal with adapted gain may then be output to an audio transducer. The user may also be provided with a control over the percentage of gain adaptation.

It will be understood, and is appreciated by persons skilled in the art, that one or more processes, sub-processes, or process steps described in connection with FIGS. 1-9 may be performed by hardware and/or software. If the process is performed by software, the software may reside in software memory (not shown) in a suitable electronic processing component or system such as, one or more of the functional components or modules schematically depicted in FIGS. 1-9. The software in software memory may include an ordered listing of executable instructions for implementing logical functions (that is, "logic" that may be implemented either in digital form such as digital circuitry or source code or in analog form such as analog circuitry or an analog source such an analog electrical, sound or video signal), and may selectively be embodied in any computer-readable medium for use by or in connection with an instruction execution system, apparatus, or device, such as a computer-based system, processor-containing system, or other system that may selectively fetch the instructions from the instruction execution system, apparatus, or device and execute the instructions. In the context of this disclosure, a "computer-readable medium" is any means that may contain, store or communicate the program for use by or in connection with the instruction execution system, apparatus, or device. The computer readable medium may selectively be, for example, but is not limited to, an electronic, magnetic, optical, electromagnetic, infrared, or semiconductor system, apparatus or device. More specific examples, but nonetheless a non-exhaustive list, of computer-readable media would include the following: a portable computer diskette (magnetic), a RAM (electronic), a read-only memory "ROM" (electronic), an erasable programmable read-only memory (EPROM or Flash memory) (electronic) and a portable compact disc read-only memory "CDROM" (optical). Note that the computer-readable medium may even be paper or another suitable medium upon which the program is printed, as the program can be electronically captured, via for instance optical scanning of the paper or other medium, then compiled, interpreted or otherwise processed in a suitable manner if necessary, and then stored in a computer memory.

The foregoing description of implementations has been presented for purposes of illustration and description. It is not exhaustive and does not limit the claimed inventions to the precise form disclosed. Modifications and variations are possible in light of the above description or may be acquired from practicing the invention. The claims and their equivalents define the scope of the invention.

What is claimed is:

1. A method for adapting a gain of an audio signal containing at least two different tracks with different signal level ranges, the method comprising:
    dynamically determining a perceived loudness of the audio signal based on a psychoacoustic model of a human hearing;
    generating loudness adaptation indicators based on the perceived loudness and a predetermined loudness;
    introducing the loudness adaptation indicators into the audio signal to generate an adapted audio signal; and
    dynamically adapting the gain for outputting the audio signal containing the at least two tracks based on the loudness adaptation indicators in the adapted audio signal at about the predetermined loudness.

2. The method of claim 1 further comprising:
    determining whether the audio signal can be localized by using a simulation of the spatial perception of the audio signal as perceived by a listener listening to the audio signal based on a binaural localization model;
    if the audio signal cannot be localized, identifying a pause in the audio signal in which noise is a dominant part of the audio signal;
    where the step of generating the loudness adaptation indicator includes generating loudness adaptation indicators corresponding to a decreased gain in the pause.

3. The method of claim 1 where the step of dynamically determining the perceived loudness includes basing the perceived loudness on signal statistics of the audio input signal.

4. The method of claim 1 where:
    each track of the audio signal contains consecutive blocks of music signals; and
    the loudness adaptation indicators are time constants describing a change of the loudness from one block to the next block.

5. The method of claim 4 where, in the step of generating the loudness adaptation indicator, a raising time constant indicates an increasing loudness between two consecutive blocks and a falling time constant describes a decreasing loudness between two consecutive blocks, where the raising time constant indicates a faster increase in loudness than the decrease in loudness indicated by the falling time constant.

6. The method of claim 4 where the time constant is an adaptive time constant that indicates a faster loudness adjustment at a beginning of a track than later during the track.

7. The method of claim 6 further comprising:
    determining whether the audio signal can be localized using a binaural localization model alone or in combination with a signal statistics model; detecting a pause when the audio signal between two tracks cannot be localized;
    where the step of generating the loudness adaptation indicator includes resetting the time constant when the pause is detected between two tracks.

8. The method of claim 1 further comprising:
    inputting a user input indicating an amount of gain correction provided by the adapted gain compared to a raw gain setting; and
    adjusting an output gain for the audio signal according to the gain correction.

9. The method of claim 1 further comprising including a delay time into the audio signal before it is output to an audio transducer, the delay time corresponding to a calculation time to determine the adapted gain for the audio signal.

10. A system for adapting a gain of an audio signal containing at least two different tracks with different signal level ranges, the system comprising:
    a loudness determination unit for determining a perceived loudness of the audio input signal based on a psychoacoustic model of a human hearing;
    a loudness adaptation unit configured to determine a loudness adaptation indicator based on the perceived loudness and a predetermined loudness, and to introduce the loudness adaptation indicator into the audio signal to generate an adapted gain signal; and
    a gain determination unit configured to adapt the gain for outputting the audio signal containing the at least two tracks based on the loudness adaptation indicators in the adapted gain signal at about the predetermined loudness.

11. The system of claim 10 further comprising:
    a pause detection unit configured to determine a pause, either between the at least two different tracks or within a track, in which noise is the dominant part of the audio signal using a simulation of the spatial perception of the audio input signal as perceived by a listener listening to the audio signal to determine when the audio signal cannot be localized, where the gain determination unit decreases the gain during the pause.

12. The system of claim 10 where each track of the audio signal includes consecutive blocks of audio signals, the loudness adaptation indicators generated by the loudness adaptation unit are time constants for the consecutive blocks of the audio signal, the time constants describing a change of the loudness from one block to the next block, where the gain determination unit adjusts the gain of the audio signal based on the time constants.

13. The system of claim 12 where the loudness adaptation unit generates a raising time constant to indicate an increasing loudness between two consecutive blocks and a falling time constant to indicate a decreasing loudness between two consecutive blocks, where the raising time constant indicates a faster increase in loudness than the decrease in loudness indicated by the falling time constant.

14. The system of claim 12 where the loudness adaptation unit determines the time constants to be adaptive time constants that vary faster at the beginning of a track from block to block than later in the track.

15. The system of claim 12 where the loudness adaptation unit resets the time constant when a pause is detected between two tracks.

16. The system of claim 11 further comprising a gain control unit configured to determine an output gain according to a gain correction factor indicating an amount of gain correction provided by the adapted gain compared to a raw gain setting.

17. The system of claim 11 further comprising a delay element for introducing a delay time into the audio signal before it is output to an audio transducer, the delay time corresponding to a calculation time to determine the adapted gain for the audio signal.

* * * * *